(12) United States Patent
Zhao et al.

(10) Patent No.: US 10,593,660 B2
(45) Date of Patent: Mar. 17, 2020

(54) ARRAY SUBSTRATE AND DISPLAY DEVICE

(71) Applicant: Wuhan China Star Optoelectronics Semiconductor Display Technology Co., Ltd., Wuhan, Hubei (CN)

(72) Inventors: Yu Zhao, Hubei (CN); Wonjoong Kim, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 211 days.

(21) Appl. No.: 15/580,390

(22) PCT Filed: Nov. 28, 2017

(86) PCT No.: PCT/CN2017/113247
§ 371 (c)(1),
(2) Date: Dec. 7, 2017

(87) PCT Pub. No.: WO2019/100412
PCT Pub. Date: May 31, 2019

(65) Prior Publication Data
US 2019/0229132 A1 Jul. 25, 2019

(30) Foreign Application Priority Data
Nov. 21, 2017 (CN) .......................... 2017 1 1166824

(51) Int. Cl.
*H01L 29/04* (2006.01)
*H01L 27/02* (2006.01)
(Continued)

(52) U.S. Cl.
CPC ...... *H01L 27/0248* (2013.01); *G02F 1/13452* (2013.01); *G02F 1/136204* (2013.01);
(Continued)

(58) Field of Classification Search
CPC .............. H01L 27/1244; H01L 27/124; H01L 27/0288; H01L 27/0266; H01L 27/0296;
(Continued)

(56) References Cited

U.S. PATENT DOCUMENTS 5,909,035 A * 6/1999 Kim .................. G02F 1/136204
257/59
7,619,696 B2 * 11/2009 Ota .................. G02F 1/136204
257/355
(Continued)

*Primary Examiner* — Shouxiang Hu
(74) *Attorney, Agent, or Firm* — Hemisphere Law, PLLC; Zhigang Ma

(57) ABSTRACT

The present invention discloses an array substrate which includes a peripheral driving circuit region. The peripheral driving circuit includes a first metal layer, a first insulating layer and a second metal layer sequentially formed on a base substrate. There is a signal transmission line provided in the driving circuit region. The signal transmission line is connected in series with a current limiting unit. The current limiting unit includes M first metal lines formed in the first metal layer at intervals and N second metal lines formed in the second metal layer at intervals. The M first metal lines and the N second metal lines are alternately connected in series with each other through vias provided in the first insulating layer, and M and N are integers greater than 1, respectively. The present invention further comprises a display device including an array substrate mentioned above.

20 Claims, 3 Drawing Sheets

(51) Int. Cl.
*H01L 27/12* (2006.01)
*G02F 1/1362* (2006.01)
*G02F 1/1345* (2006.01)
*H01L 49/02* (2006.01)
*H01L 23/60* (2006.01)
*H01L 23/64* (2006.01)

(52) U.S. Cl.
CPC ........ *G02F 1/136286* (2013.01); *H01L 23/60* (2013.01); *H01L 23/645* (2013.01); *H01L 27/0266* (2013.01); *H01L 27/0288* (2013.01); *H01L 27/0296* (2013.01); *H01L 27/124* (2013.01); *H01L 27/1244* (2013.01); *H01L 28/10* (2013.01); *G02F 2001/13629* (2013.01)

(58) Field of Classification Search
CPC ..... H01L 27/1255; H01L 28/10; H01L 23/60; H01L 23/645; H01L 27/0248; G02F 1/13452; G02F 1/136286; G02F 1/136204; G02F 2001/13629
See application file for complete search history.

(56) References Cited

U.S. PATENT DOCUMENTS

| | | | |
|---|---|---|---|
| 7,926,165 B2* | 4/2011 | Hong | H01Q 1/2283 |
| | | | 29/600 |
| 7,990,170 B2* | 8/2011 | Shimomura | G09G 3/006 |
| | | | 324/760.01 |
| 9,959,964 B2* | 5/2018 | Yun | H01F 10/12 |
| 2011/0234962 A1* | 9/2011 | Yokonuma | G02F 1/1345 |
| | | | 349/143 |

* cited by examiner

ARRAY SUBSTRATE AND DISPLAY DEVICE

RELATED APPLICATIONS

The present application is a National Phase of International Application Number PCT/CN2017/113247, filed Nov. 28, 2017, and claims the priority of China Application No. 201711166824.6, filed Nov. 21, 2017.

FIELD OF THE DISCLOSURE

The present invention relates to a field of display technology, and in particular, to an array substrate and a display device including the array substrate.

BACKGROUND

A flat panel display device has many advantages such as thin body, power saving, no radiation and has been widely used. The existing flat panel display device mainly includes a liquid crystal display (LCD) and an organic light emitting display (OLED).

A thin Film Transistor (TFT) array substrate is an important part of a flat panel display device. The thin film transistor (TFT) array substrate has features such as the follows. For example, a plurality of pixels are arranged in a region surrounded by a plurality of data lines and a plurality of scan lines crossing each other. Each pixel comprises a liquid crystal capacitor and a thin film transistor for performing a display operation. The thin film transistor is turned on in response to a gate voltage so as to apply a data signal onto the pixel.

During a manufacturing process of the array substrate, some static electricity may inevitably be generated and accumulated on the array substrate because the manufacturing equipment may inevitably come into contact with the array substrate. When the static electricity is accumulated to a certain extent, an electrostatic discharge (ESD) phenomenon may occur at a site such as a tip of a metal pattern where the static electricity is relatively easy to accumulate. When it occurs in a metal line, it may easily cause a short circuit or a disconnection of the transmission line. When it occurs in a display area, it easily lead to breakdown of the thin film transistor and make its original switching function failed, affecting the production yield of the product.

In order to effectively discharge the static electricity accumulated in the array substrate, current technology is used to provide a grounding line in the periphery of the array substrate to discharge the static electricity to the ground. Usually, signal transmission lines, such as data lines and scan lines, are connected to the grounding line through electrostatic discharge elements. Furthermore, in order to avoid damage to the signal transmission line due to a high current generated during the electrostatic discharge, it is usually also necessary to connect a current limiting element, such as a current limiting resistor, in series with the signal transmission line. In current art, the setting of the current limiting resistor is generally formed by patterning a semiconductor layer or a gate metal layer or other metal layer on the array substrate. When the current limiting resistor is formed by patterning the semiconductor layer, its resistance is large enough to provide a good current limiting effect. However, the semiconductor layer usually has poor heat dissipation performance and thus the current limiting resistor easily fails. When the current limiting resistor is formed by patterning the gate metal layer or other metal layer, it has better heat dissipation performance, but cannot provide a good protection against a large current because of its small resistance.

Therefore, there is a need to improve and develop the current art.

SUMMARY

In view of the above, the present invention provides an array substrate that can effectively prevent a device such as a signal transmission line from being damaged by a large current generated during an electrostatic discharge.

In order to achieve the above object, the present invention provides the following technical solutions.

An array substrate is provided which includes a peripheral driving circuit region including a first metal layer, a first insulating layer and a second metal layer sequentially formed on a base substrate. There is a signal transmission line provided in the driving circuit region, and the signal transmission line is connected in series with a current limiting unit which includes M first metal lines formed in the first metal layer at intervals and N second metal lines formed in the second metal layer at intervals. The M first metal lines and the N second metal lines are alternately connected in series with each other through vias provided in the first insulating layer, wherein M and N are integers greater than 1, respectively.

The length of the first metal line is 5~10 µm and the length of the second metal line is 5~10 µm.

A distance between two adjacent first metal lines is 2~5 µm, and a distance of two adjacent second metal lines is 2~5 µm.

The number M of the first metal lines is 10≤M≤20, and the number N of the second metal lines is 10≤N≤20.

The number M of the first metal lines is equal to the number N of the second metal lines, or the number M of the first metal lines is different from the number N of the second metal lines by one.

The signal transmission line is further connected with an electrostatic discharge unit. The electrostatic discharge unit comprises an N-type thin film transistor and a P-type thin film transistor. The source of the N-type thin film transistor and the source of the P-type thin film transistor are respectively connected to a first connection point in the signal transmission line, the gate and the drain of the N-type thin film transistor are connected to each other and to a first discharge line, and the gate and the drain of the P-type thin film transistor are connected to each other and connected to a second discharge line.

In one transmission line, there are two current limiting units respectively connected in series at two sides of the first connection point.

The array substrate includes a display region in which pixel units arranged in matrix are provided, and the signal transmission lines extend into the display region for inputting display signals to the pixel units. The signal transmission lines include data lines and scan lines.

The signal transmission lines are disposed in the first metal layer. Alternatively, the signal transmission lines can also be disposed in the second metal layer.

The present invention also provides a display device, comprising the array substrate as described above.

According to the array substrate provided in the embodiment of the present invention, a plurality of metal lines that are alternatively connected in series in two metal layers to form an inductance element in a shape similar to a spiral winding is provided to function as a current limiting unit connected in series with a signal transmission line. The current limiting unit has a sufficiently large resistance value and a good thermal conductivity, will not be broken due to thermal energy, and can effectively prevent the signal transmission line from a damage resulted from a large current generated during electrostatic discharge. Furthermore, the current limiting unit is formed as a structure of an inductance element in a spiral winding shape, and thus has a function of passing a direct current while resisting an alternating current, as well as passing a low frequency signal while resisting a high frequency signal, and thereby can spuriously protect circuit elements in the array substrate.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

Figure 1:
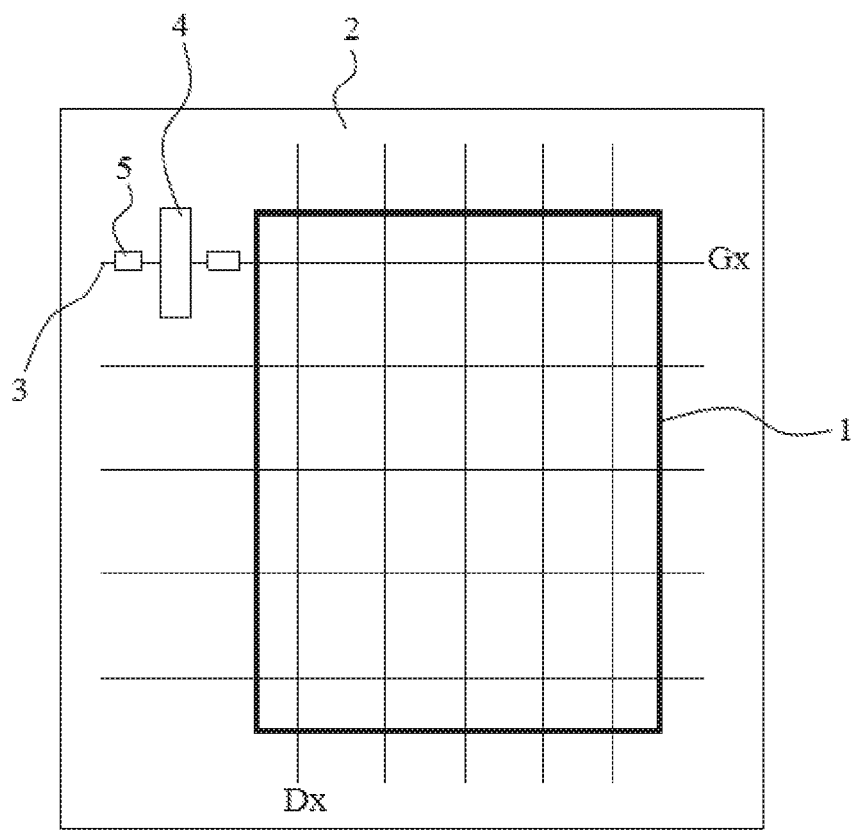
FIG. 1 is a schematic structural diagram of an array substrate according to an embodiment of the present invention.

The specific structural and functional details disclosed herein are only representative and are intended for describing exemplary embodiments of the disclosure. However, the disclosure can be embodied in many forms of substitution, and should not be interpreted as merely limited to the embodiments described herein.

To make the objectives, technical solutions, and advantages of the present invention clearer, the contents below will describe specific embodiments of the present invention in detail with reference to the accompanying drawings. Examples by means of these preferred embodiments are illustrated in the drawings. The embodiments of the present invention shown in the drawings and described in accordance with the drawings are merely exemplary and the present invention is not limited to these embodiments.

Here, it should also be noted that in order to avoid obscuring the present invention by unnecessary details, only the structures and/or processing steps that are closely related to the solutions according to the present invention are shown in the drawings, Other details that are not so relevant to the present invention are omitted.

The terms used herein are only for illustrating concrete embodiments rather than limiting the exemplary embodiments. Unless otherwise indicated in the content, singular forms "a" and "an" also include plural. Moreover, the terms "comprise" and/or "include" define the existence of described features, integers, steps, operations, units and/or components, but do not exclude the existence or addition of one or more other features, integers, steps, operations, units, components and/or combinations thereof.

This embodiment of the present invention provides an array substrate. FIG. 1 shows a layout structure of the array substrate. As shown in FIG. 1, the array substrate includes a display region 1 and a peripheral driving circuit region 2 located at the periphery of the display region 1. The display region 1 is provided with pixel units arranged in matrix and signal transmission lines 3 electrically connecting the pixel units to the peripheral driving circuit region 2. The signal transmission lines 3 include data lines Dx and scan lines Gx. The data lines Dx and the scan lines Gx are crisscrossed in the display region 1. Each pixel unit is provided with a thin film transistor, and each thin film transistor is provided with a gate, a source and a drain, as well as an insulating layer and an active layer correspondingly.

Figure 2:
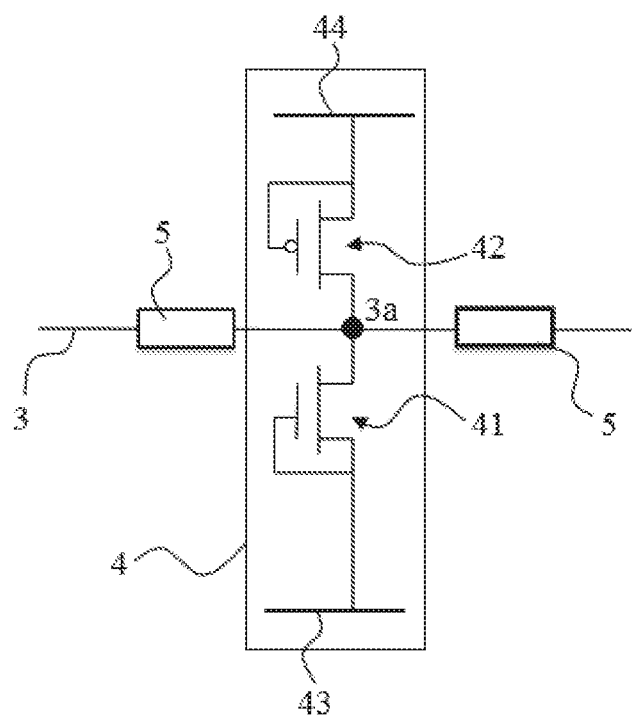
FIG. 2 is an equivalent circuit diagram of a connection between an electrostatic discharge unit according to the embodiment of the present invention with the signal transmission line.

Referring to FIG. 1 and FIG. 2, the driving circuit region 2 is also provided with signal transmission lines 3 extending from the display region 1. The signal transmission lines 3 are connected with electrostatic discharge units 4 respectively. One scan line Gx is taken as an example in FIG. 1. The electrostatic discharge unit 4 includes an N-type thin film transistor 41 and a P-type thin film transistor 42. The source of the N-type thin film transistor 41 and the source of the P-type thin film transistor 42 respectively connected to a first connection point 3a in the signal transmission line 3. The gate and the drain of the N-type thin film transistor 41 are connected to each other and to a first discharge line 43. The gate and the drain of the P-type thin film transistor 42 are connected to each other and to a second discharge line 44. The electrostatic discharge unit 4 is configured to discharge the static electricity accumulated in the signal transmission line 3 to prevent the static electricity from being input into the display region 1 along the signal transmission line 3 to damage the signal transmission line 3 itself and the other devices in the display region 1. Furthermore, in order to avoid the signal transmission line 3 from being damaged by a large current generated during an electrostatic discharge, the signal transmission line 3 is further connected in series with a current limiting unit 5 located in the driving circuit region 2. In the present embodiment, there are two current limiting units 5 respectively provided at two sides of the first connection point 3a to connect with the signal transmission line 3 in series.

Figure 3:
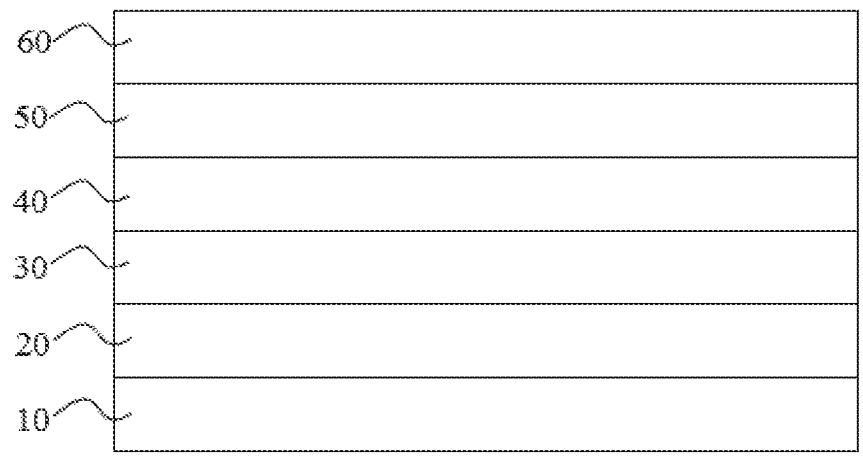
FIG. 3 is a schematic cross-sectional structural diagram of an array substrate according to the embodiment of the present invention.

As shown in FIG. 3, the array substrate includes a plurality of functional thin-film layers disposed in sequence. Specifically, the array substrate includes a semiconductor layer 20, a second insulating layer 30, a first metal layer 40, a first insulating layer 50 and a second metal layer 60 provided on a base substrate 10 in sequence. The TFTs and the signal transmission lines, i.e., data lines and scan lines, in the display region 1, as well as the TFTs in the electrostatic discharge units 4 are all formed in the above functional film layers by means of a patterning process. For example, the semiconductor layer 20 is used to form active layers of the thin film transistors by means of the patterning process, the first metal layer 40 is used to be pattered to form the gates of the thin film transistors and the scan lines, and the second metal layer 60 is used to be pattered to form the sources and the drains of the thin film transistors and the data lines. Furthermore, the current limiting units 5 are also formed in the above plurality of functional thin film layers through the patterning process.

The material of the first metal layer 40 and the second metal layer 60 is a single metal layer of Cr, W, Ti, Ta, Mo, Al, or Cu, or a composite metal layer combined from any two or more metals of Cr, W, Ti, Ta, Mo, Al, and Cu. The material of the first insulating layer 50 and the second insulating layer 30 can be a single layer structure of $SiO_x$ or $SiN_x$, or a combined insulating layer consisting of a combination of $SiO_x$ and $SiN_x$. The base substrate 10 can be a glass substrate, and the semiconductor layer 20 can be an amorphous silicon (a-Si) layer.

Figure 4:
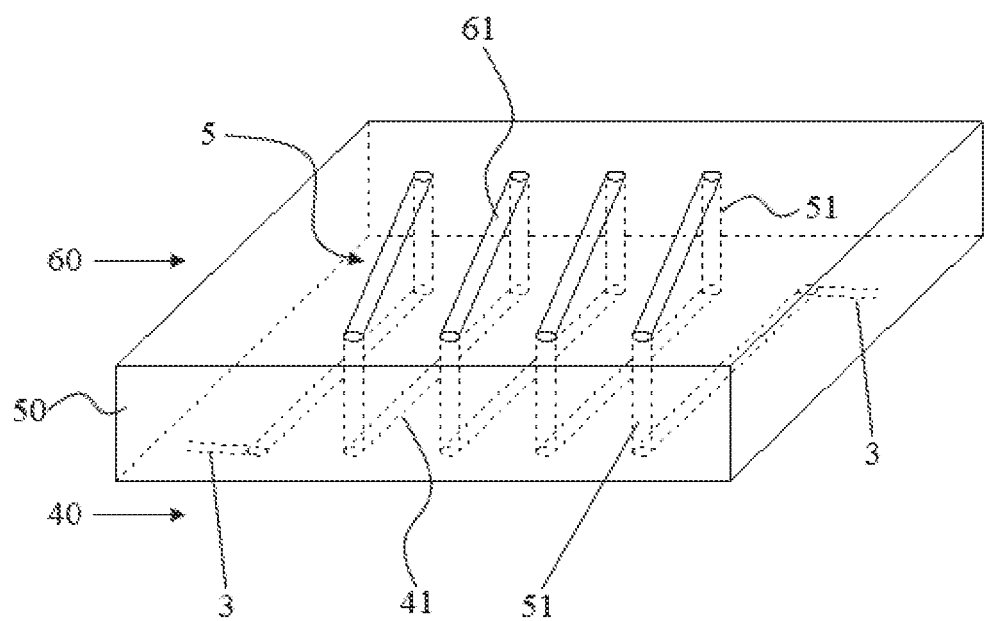
FIG. 4 is a schematic structural diagram of a current limiting unit according to the embodiment of the present invention.

In the present embodiment, the current limiting units 5 are formed in the first metal layer 40, the first insulating layer 50 and the second metal layer 60. Specifically, as shown in FIG. 4, each of the current-limiting units 5 includes M first metal lines 41 formed in the first metal layer 40 at intervals and N second metal lines 61 formed in the second metal layer 60 at intervals. The M first metal lines 41 and the N second metal lines 61 are alternately connected in series through vias 51 provided in the first insulating layer 50, and M and N are each an integer greater than one.

The number M of the first metal lines is equal to the number N of the second metal lines, or the number M of the first metal lines is different from the number N of the second metal lines by one. The number M of the first metal lines and the number N of the second metal lines are specifically set according to actual needs. In a preferred technical solution, M and N are set in a range of 10-20.

Referring to FIG. 4, it is taking M=N+1 as an example. That is, the number M of the first metal lines is one more than the number N of the second metal lines. The first to Mth of the first metal lines 41 are formed in the first metal layer 40 at intervals, and the first to Nth of the second metal lines 61 are formed in the second metal layer 60 at intervals. The specific structure of the current limiting unit 5 is as follows. One end of the first of first metal lines 41 is connected to the signal transmission line 3, and the other end of the first of the first metal lines 41 is connected to one end of the first of the second metal lines 61 through a via 51. The other end of the first of the second metal lines 61 is connected to one end of a second of the first metal lines 41 through a via 51. The other end of the second of the first metal lines 41 is connected to one end of a second of the second metal lines 61 through a via 51, and so on until the Nth of the second metal lines 61 is connected to one end of the Mth of the first metal lines 41 through a via 51, and finally the other end of the Mth of the first metal lines 41 is connected to the signal transmission line 3 again, whereby a current limiting unit 5 similar to a spiral winding inductance is connected in series to the signal transmission line 3.

The length of each first metal line 41 can be set to 5~10 μm, the length of each second metal line 61 can be set to 5~10 μm, and the length of the first metal line 41 and the length of the second metal line 61 are approximately equal. A distance between two adjacent first metal lines 41 can be set in a range of 2~5 μm and a distance between two adjacent second metal lines 61 can also be set in a range of 2~5 μm.

In the above embodiment, by arranging a plurality of metal lines in two metal layers to be serially and alternately connected with each other, an inductance element in a shape similar to a spiral winding is thus formed to function as a current limiting unit connected in series with the signal transmission line. The current limiting unit has a sufficiently large resistance value and good thermal conductivity, will not be broken due to heat energy, and can effectively avoid the signal transmission line and other devices from being damaged by a high current generated during the electrostatic discharge. Furthermore, the current limiting unit is formed by an inductance element in a structure of a helically winding, which also has a function of passing a direct current while resisting an alternating current, as well as a function of passing a low frequency signal while blocking a high frequency signal, so as to spuriously protect the circuit devices on the array substrate.

Figure 5:
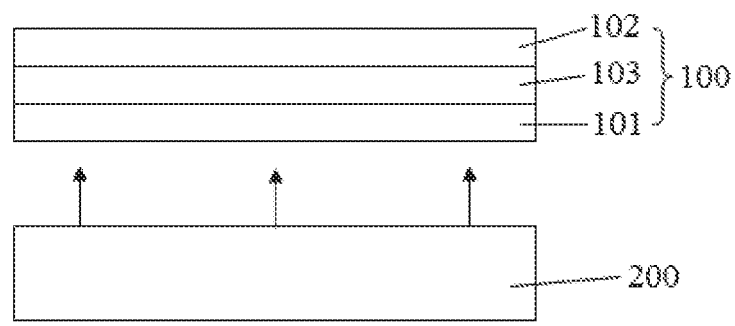
FIG. 5 is a schematic structural diagram of a display device according to the embodiment of the present invention.

The present embodiment further provides a display device, in which the array substrate provided by the embodiment of the present invention is used. The display device may be, for example, a thin film transistor liquid crystal display device (TFT-LCD) or an organic electroluminescence display device (OLED). By adopting the array substrate provided by the embodiments of the present invention, the display device may have more advantages over the prior art, such as excellent electrostatic discharge performance and improved product quality. Specifically, as shown in FIG. 5, taking the TFT-LCD as an example, the liquid crystal display device includes a liquid crystal panel 100 and a backlight module 200. The liquid crystal panel 100 is disposed opposite to the backlight module 200. The backlight module 200 provides a display light source to the liquid crystal panel 100 so that the liquid crystal panel 100 displays an image. The liquid crystal panel 100 includes an array substrate 101 and a filter substrate 102 opposite to each other, as well as a liquid crystal layer 103 between the array substrate 101 and the filter substrate 102. The array substrate 101 adopts the array substrate provided by the embodiment of the present invention.

The foregoing contents are detailed description of the present invention in conjunction with specific preferred embodiments, and the concrete embodiments of the present invention are not limited to these description. For the person skilled in the art of the disclosure, without departing from the concept of the disclosure, simple deductions or substitutions can be made and should be included in the protection scope of the application.

What is claimed is:

1. An array substrate, comprising a peripheral driving circuit region including a first metal layer, a first insulating layer and a second metal layer sequentially formed on a base substrate, as well as a signal transmission line provided in the driving circuit region, wherein the signal transmission line is connected in series with a current limiting unit which includes M first metal lines formed in the first metal layer at intervals and N second metal lines formed in the second metal layer at intervals, the M first metal lines and the N second metal lines are alternately connected in series with each other through vias provided in the first insulating layer, and wherein M and N are respectively integers greater than 1.

2. The array substrate as claimed in claim 1, wherein the length of the first metal line is 5~10 μm and the length of the second metal line is 5~10 μm.

3. The array substrate as claimed in claim 2, wherein a distance between two adjacent first metal lines is 2~5 μm, and a distance of two adjacent second metal lines is 2~5 μm.

4. The array substrate as claimed in claim 1, wherein the number M of the first metal lines is 10≤M≤20, and the number N of the second metal lines is 10≤N≤20.

5. The array substrate as claimed in claim 4, wherein the number M of the first metal lines is equal to the number N of the second metal lines, or the number M of the first metal lines is different from the number N of the second metal lines by one.

6. The array substrate as claimed in claim 1, wherein the signal transmission line is further connected with an electrostatic discharge unit which comprises an N-type thin film transistor and a P-type thin film transistor, and wherein the source of the N-type thin film transistor and the source of the P-type thin film transistor are respectively connected to a first connection point in the signal transmission line, and the gate and the drain of the N-type thin film transistor are connected to each other and to a first discharge line, and the gate and the drain of the P-type thin film transistor are connected to each other and connected to a second discharge line.

7. The array substrate as claimed in claim 6, wherein in one transmission line, there are two current limiting units respectively connected in series at two sides of the first connection point.

8. The array substrate as claimed in claim 1, wherein the array substrate further includes a display region in which pixel units arranged in matrix are provided, and wherein the signal transmission line is one of a plurality of signal transmission lines extending into the display region for inputting display signals to the pixel units, and the signal transmission lines include data lines and scan lines.

9. The array substrate as claimed in claim 1, wherein the signal transmission line is one of a plurality of signal transmission lines disposed in the first metal layer.

10. The array substrate as claimed in claim 1, wherein the signal transmission line is one of a plurality of signal transmission lines disposed in the second metal layer.

11. A display device, comprising an array substrate having a peripheral driving circuit region including a first metal layer, a first insulating layer and a second metal layer sequentially formed on a base substrate, as well as a signal transmission line provided in the driving circuit region, wherein the signal transmission line is connected in series with a current limiting unit which includes M first metal lines formed in the first metal layer at intervals and N second metal lines formed in the second metal layer at intervals, the M first metal lines and the N second metal lines are alternately connected in series with each other through vias provided in the first insulating layer, and wherein M and N are integers greater than 1, respectively.

12. The array substrate as claimed in claim 11, wherein the length of the first metal line is 5~10 μm and the length of the second metal line is 5~10 μm.

13. The array substrate as claimed in claim 12, wherein a distance between two adjacent first metal lines is 2~5 μm, and a distance of two adjacent second metal lines is 2~5 μm.

14. The array substrate as claimed in claim 11, wherein the number M of the first metal lines is $10 \leq M \leq 20$, and the number N of the second metal lines is $10 \leq N \leq 20$.

15. The array substrate as claimed in claim 14, wherein the number M of the first metal lines is equal to the number N of the second metal lines, or the number M of the first metal lines is different from the number N of the second metal lines by one.

16. The array substrate as claimed in claim 11, wherein the signal transmission line is further connected with an electrostatic discharge unit which comprises an N-type thin film transistor and a P-type thin film transistor, and wherein the source of the N-type thin film transistor and the source of the P-type thin film transistor are respectively connected to a first connection point in the signal transmission line, and the gate and the drain of the N-type thin film transistor are connected to each other and to a first discharge line, and the gate and the drain of the P-type thin film transistor are connected to each other and connected to a second discharge line.

17. The array substrate as claimed in claim 16, wherein in one transmission line, there are two current limiting units respectively connected in series at two sides of the first connection point.

18. The array substrate as claimed in claim 11, wherein the array substrate further comprise a display region in which pixel units arranged in matrix are provided, and wherein the signal transmission line is one of a plurality of signal transmission lines extending into the display region for inputting display signals to the pixel units, and the signal transmission lines include data lines and scan lines.

19. The array substrate as claimed in claim 11, wherein the signal transmission line is one of a plurality of signal transmission lines disposed in the first metal layer.

20. The array substrate as claimed in claim 11, wherein the signal transmission line is one of a plurality of signal transmission lines disposed in the second metal layer.

* * * * *